United States Patent
Warke et al.

(10) Patent No.: US 11,221,411 B2
(45) Date of Patent: Jan. 11, 2022

(54) POWER EFFICIENT LIDAR

(71) Applicant: TEXAS INSTRUMENTS INCORPORATED, Dallas, TX (US)

(72) Inventors: Nirmal C. Warke, Saratoga, CA (US); David P. Magee, Allen, TX (US); Baher S. Haroun, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1116 days.

(21) Appl. No.: 15/638,255

(22) Filed: Jun. 29, 2017

(65) Prior Publication Data
US 2018/0017678 A1 Jan. 18, 2018

Related U.S. Application Data

(60) Provisional application No. 62/363,467, filed on Jul. 18, 2016.

(51) Int. Cl.
*G01C 3/08* (2006.01)
*G01S 17/26* (2020.01)
(Continued)

(52) U.S. Cl.
CPC .............. *G01S 17/26* (2020.01); *G01S 7/484* (2013.01); *G01S 7/4861* (2013.01); *G01S 17/10* (2013.01);
(Continued)

(58) Field of Classification Search
CPC ...... G01S 13/08; G01S 7/4021; G01S 7/4052; G01S 7/4865; G01S 7/4915; G01S 7/497;
(Continued)

(56) References Cited

U.S. PATENT DOCUMENTS 5,226,847 A * 7/1993 Thomas, III ............. A61B 8/12
600/463
5,525,996 A * 6/1996 Aker ..................... G01S 13/528
342/104

(Continued)

FOREIGN PATENT DOCUMENTS

EP 1055941 11/2000
EP 2963445 6/2016

OTHER PUBLICATIONS

International Search Report in corresponding PCT Patent Application No. PCT/US2017/031994, dated Aug. 14, 2017 (2 pages).
(Continued)

*Primary Examiner* — Samantha K Nickerson
(74) *Attorney, Agent, or Firm* — Ray A. King; Charles A. Brill; Frank D. Cimino

(57) ABSTRACT

Described examples include an integrated circuit having an analog-to-digital converter operable to receive an input signal derived from a light signal and convert the input signal to a digital received signal, the analog-to-digital converter operable to receive the input signal during at least one window. The integrated circuit further has a receiver operable to receive the digital received signal, the receiver operable to determine a distance estimate of an object from which the light signal is reflected based on the digital received signal. In an example, the window locations are chosen to correspond to the locations of maximum slope in the signal.

29 Claims, 7 Drawing Sheets

(51) Int. Cl.
*H03F 3/08* (2006.01)
*G01S 17/10* (2020.01)
*G01S 7/4861* (2020.01)
*G01S 17/36* (2006.01)
*G01S 7/484* (2006.01)
*G01S 17/34* (2020.01)

(52) U.S. Cl.
CPC .............. *G01S 17/34* (2020.01); *G01S 17/36* (2013.01); *H03F 3/08* (2013.01)

(58) Field of Classification Search
CPC ...... G01S 7/52004; G01S 7/526; G01S 15/08; G01S 17/08; G01S 2007/4069
See application file for complete search history.

(56) References Cited

U.S. PATENT DOCUMENTS

| | | | |
|---|---|---|---|
| 5,742,379 A | 4/1998 | Reifer | |
| 5,745,437 A | 4/1998 | Wachter et al. | |
| 5,784,023 A | 7/1998 | Bluege | |
| 5,889,490 A | 3/1999 | Wachter et al. | |
| 6,369,880 B1 | 4/2002 | Steinlechner | |
| 6,522,395 B1* | 2/2003 | Bamji | G01S 7/487 |
| | | | 356/5.01 |
| 7,262,402 B2 | 8/2007 | Niclass et al. | |
| 7,512,237 B1 | 3/2009 | Schantz et al. | |
| 7,701,559 B2 | 4/2010 | Bridges et al. | |
| 2002/0176067 A1* | 11/2002 | Charbon | H04N 5/363 |
| | | | 356/4.01 |
| 2004/0105087 A1 | 6/2004 | Gogolla et al. | |
| 2004/0246171 A1* | 12/2004 | Orr | G01S 7/495 |
| | | | 342/174 |
| 2009/0059201 A1 | 3/2009 | Willner et al. | |
| 2010/0026984 A1* | 2/2010 | Lewis | G01S 17/32 |
| | | | 356/5.01 |
| 2010/0027602 A1 | 2/2010 | Abshire et al. | |
| 2015/0312554 A1* | 10/2015 | Banks | G01S 7/4865 |
| | | | 348/50 |
| 2016/0003946 A1 | 1/2016 | Gilliland et al. | |
| 2016/0025843 A1 | 1/2016 | Sebastian et al. | |
| 2016/0047891 A1* | 2/2016 | Campbell | G01S 7/352 |
| | | | 702/150 |
| 2016/0223588 A1* | 8/2016 | Fox | G01S 17/08 |
| 2016/0231420 A1 | 8/2016 | Kryvobok | |
| 2017/0082737 A1 | 3/2017 | Slobodyanyuk et al. | |

OTHER PUBLICATIONS

"Chung et al., "Optical Orthogonal Codes: Design, Analysis, and Applications," IEEE Trans on Information Theory, vol. 35. No. 3, May 1989, IEEE, 445 Hoes Lane, Piscataway, NJ 08854-4141 USA; accessed Apr. 11, 2017 http://www.math.ucsd.edu/~fan/mypaps/fanpap/97_opticalorthocodes.pdf".

Baltsavias "Airbone laser scanning: basic relations and formulas" ISPRS J Photogramm Remote Sens (1999) 54:199-214. doi:10.1016/S0924-2716(99)00015-5 Elsevier B.V., Radarweg 29, 1043 NX Amsterdam, The Netherlands, accessed on Jun. 29, 2017, http://www2.geog.ucl.ac.uk/~mdisney/teaching/teachingNEW/PPRS/papers/Baltsavias_Lidar.pdf.

\* cited by examiner

POWER EFFICIENT LIDAR

CROSS-REFERENCE TO RELATED APPLICATIONS

This application claims the benefit under 35 U.S.C. § 119(e) to co-owned U.S. Provisional Patent Application Ser. No. 62/363,467, filed Jul. 18, 2016, which is hereby fully incorporated herein by reference. In addition, this application is related to co-owned U.S. Provisional Application Ser. No. 62/334,098, filed May 10, 2016, co-owned U.S. application Ser. No. 15/396,457, filed Dec. 31, 2016, co-owned U.S. Provisional Patent Application Ser. No. 62/334,107, filed May 10, 2016, co-owned U.S. application Ser. No. 15/484,975, filed Apr. 11, 2017, co-owned U.S. Provisional Application Ser. No. 62/334,117, filed May 10, 2016, and co-owned U.S. application Ser. No. 15/485,147, filed Apr. 11, 2017, which applications are each hereby fully incorporated herein by reference.

TECHNICAL FIELD

This disclosure relates generally to LIDAR, and, in particular, to efficient operation of LIDAR devices.

BACKGROUND

LIDAR is a ranging technology used to estimate distance to an object based on transmitting light energy. Typical LIDAR systems operate by reflecting a transmitted narrow pulse of light off an object and estimating the amount of time it takes the pulse to return. An alternative approach is amplitude modulated continuous wave (AMCW) based LIDAR. In AMCW LIDAR, the transmitter modulates the intensity of the light with a continuous wave (CW) signal. The receiver typically estimates the time of flight based on the phase of the received CW signal relative to the transmitted CW signal.

As noted hereinabove, LIDAR (also called LiDAR, lidar, and LADAR) is a method for measuring distance to an object by illuminating that object with a laser light. The name LIDAR is sometimes considered an acronym of Light Detection And Ranging or Light Imaging, Detection, And Ranging. LIDAR was originally a portmanteau of the words "light" and "radar." In LIDAR systems, a source transmits light into a field of view and the light reflects off objects. Sensors receive the reflected light. In some LIDAR systems, a flash of light illuminates an entire scene. In such flash LIDAR systems, arrays of time-gated photodiodes receive reflections from objects illuminated by the light, and the time it takes for the reflections to arrive at various sensors in the array is determined. In an alternative approach, a scan, such as a raster scan, can illuminate a scene in a continuous scan fashion. A source transmits light or light pulses during the scan. Sensors that can also scan the pattern, or fixed sensors directed towards the field of view, receive reflective pulses from objects illuminated by the light. The light can be a scanned beam or moving spot. Time-of-flight computations can determine the distance from the transmitter to objects in the field of view that reflect the light. The time-of-flight computations can create distance and depth maps. Light scanning and LIDAR applications include: ranging; metrology; mapping; surveying; navigation; microscopy; spectroscopy; object scanning; and industrial applications. Recently, LIDAR applications also include: security; robotics; industrial automation; and mobile systems. Vehicles use LIDAR in navigation and collision avoidance systems. Autonomous vehicles and mobile robots use LIDAR for collision avoidance and scene detection.

SUMMARY

In accordance with an example, an integrated circuit includes an analog-to-digital converter operable to receive an input signal derived from a light signal and convert the input signal to a digital received signal, the analog-to-digital converter operable to receive the input signal during at least one window. The integrated circuit further includes a receiver operable to receive the digital received signal, the receiver operable to determine a distance estimate of an object from which the light signal is reflected based on the digital received signal.

DETAILED DESCRIPTION

Corresponding numerals and symbols in the different figures generally refer to corresponding parts unless otherwise indicated. The figures are not necessarily drawn to scale.

The term "coupled" may include connections made with intervening elements, and additional elements and various connections may exist between any elements that are "coupled."

Figure 1:
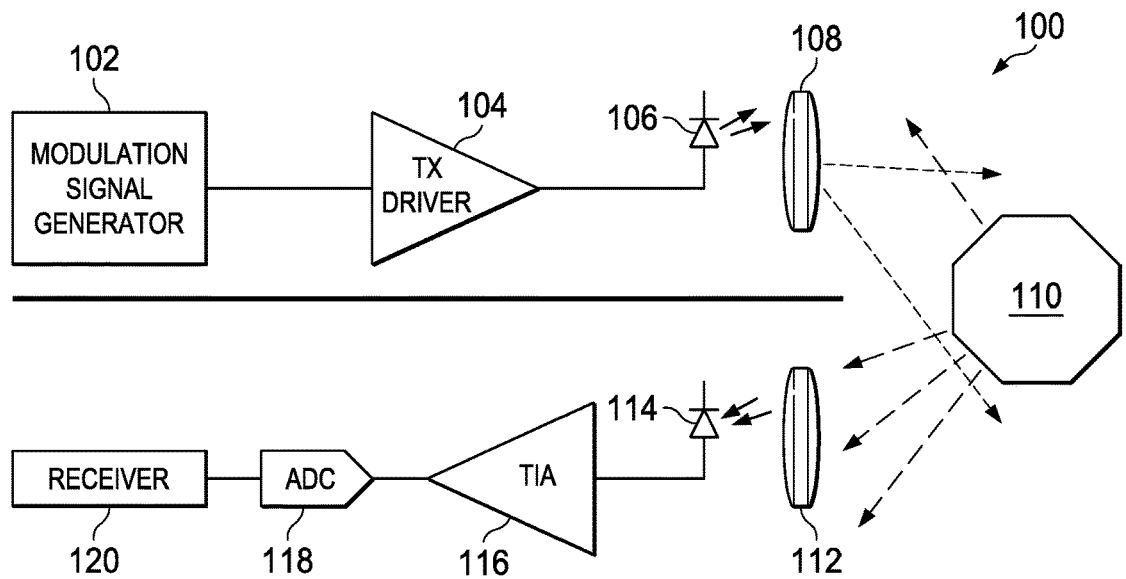
FIG. 1 is a block diagram of a LIDAR system.

FIG. 1 is a block diagram of a LIDAR system. LIDAR system 100 includes modulation signal generator 102, which provides a modulation signal to transmit driver 104. Transmit driver 104 drives laser diode 106. Optics 108 collimates and directs the modulated light onto a field of view that includes object 110. Optics 108 may be a fixed lens system or one of many mechanisms for scanning the light signal across a scene. Object 110 reflects and scatters the light signal. Optics 112 receives a portion of the reflected light signal and focuses it onto photodiode 114. Trans-impedance amplifier (TIA) 116 amplifies the output of photodiode 114 and provides the amplified signal to analog-to-digital converter (ADC) 118. ADC 118 provides a digital representation of the output of TIA 116 to receiver 120. Because of the complex circuitry of ADCs and because ADC 118 continuously samples the output of TIA 116, ADC 118 consumes a large amount of power. Receiver 120 processes the digital input from ADC 118 as described hereinbelow regarding FIGS. 2 and 3.

Figure 2:
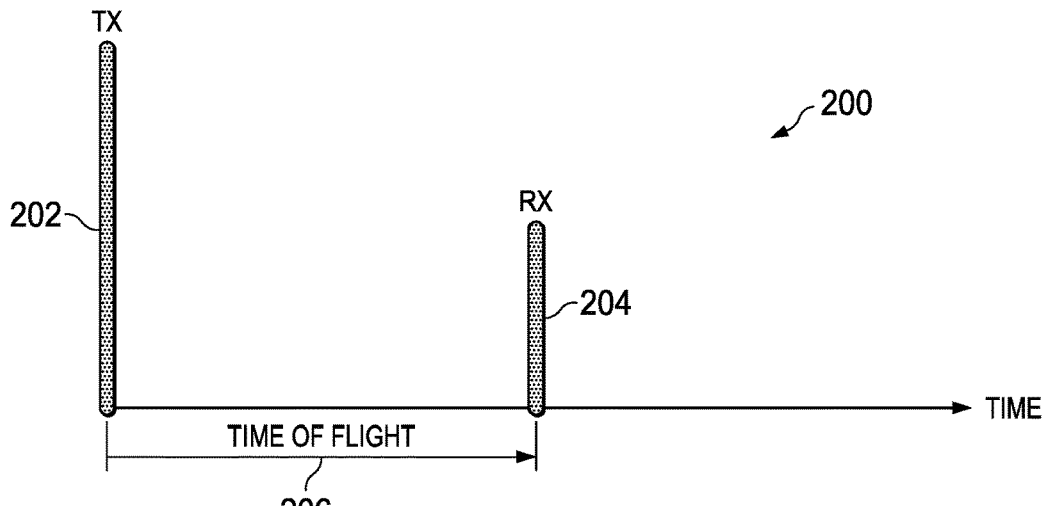
FIG. 2 is a graph showing operation of a LIDAR system.

FIG. 2 is a signal graph showing an example operation of LIDAR system 100 of FIG. 1. In FIG. 2, the modulation signal is a pulse. Graph 200 shows transmit pulse 202 at a first time followed by receive pulse 204. The speed of light is known, so the distance of object 110 (FIG. 1) from the transmitter can be estimated using time of flight 206. That is, the distance is estimated as given in Equation 1:

$$d = (c \cdot t_{TOF})/2 \quad (1)$$

where d is the distance, c is the speed of light and $t_{TOF}$ is the time of flight. The speed of light times the time of flight is halved to account for the travel of the light pulse to, and from, the object.

Receive pulse 204 has significantly smaller amplitude than transmit pulse 202. The difference between the amplitudes of the transmit pulse and the receive pulse in an application is much greater than the examples shown in FIG. 2. The reduced amplitude in the received pulse is due to the scattering, absorption and divergence of the transmitted light. Therefore, it is sometimes difficult to discriminate between the receive pulse 204 and noise. In addition, the losses during flight make it necessary to use powerful lasers to ensure that the receiving photodiode receives a pulse of adequate amplitude.

Figure 3:
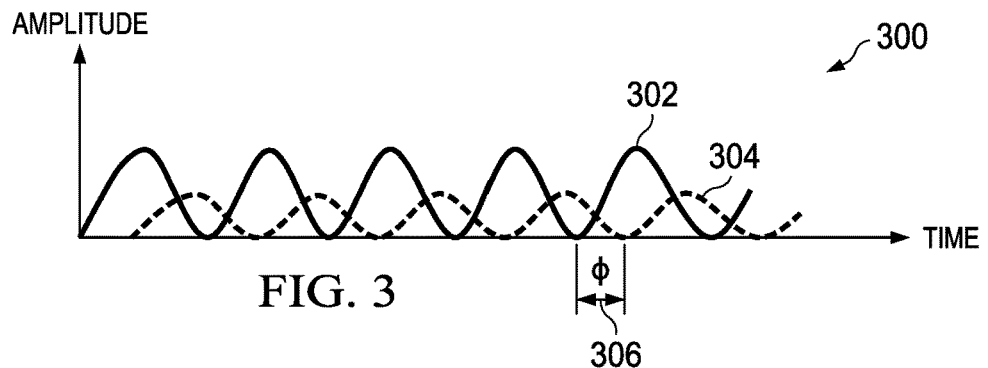
FIG. 3 is a graph of the operation of a LIDAR system using a continuous wave modulation signal.

FIG. 3 is a signal graph of the operation of LIDAR system 100 using a continuous wave modulation signal. Graph 300 shows modulation signal 302 and received signal 304. Modulation signal generator 102 (FIG. 1) modulates the driving signal of transmit driver 104 (FIG. 1) with modulation signal 302. Photodiode 114 (FIG. 1) receives the light signal reflected off object 110 (FIG. 1). TIA 116 amplifies the output of photodiode 114 to provide received signal 304. The phase difference 306 (φ is directly proportional to the time of flight ($t_{TOF}$) according to Equation 2:

$$t_{TOF} = \frac{\phi}{2\pi f} \quad (2)$$

Where f is the frequency of the modulation signal in Hz and φ is the phase difference 306 in radians. Equation 1 determines a distance estimate of object 110 using the $t_{TOF}$ determined from Equation 2.

Figure 4:
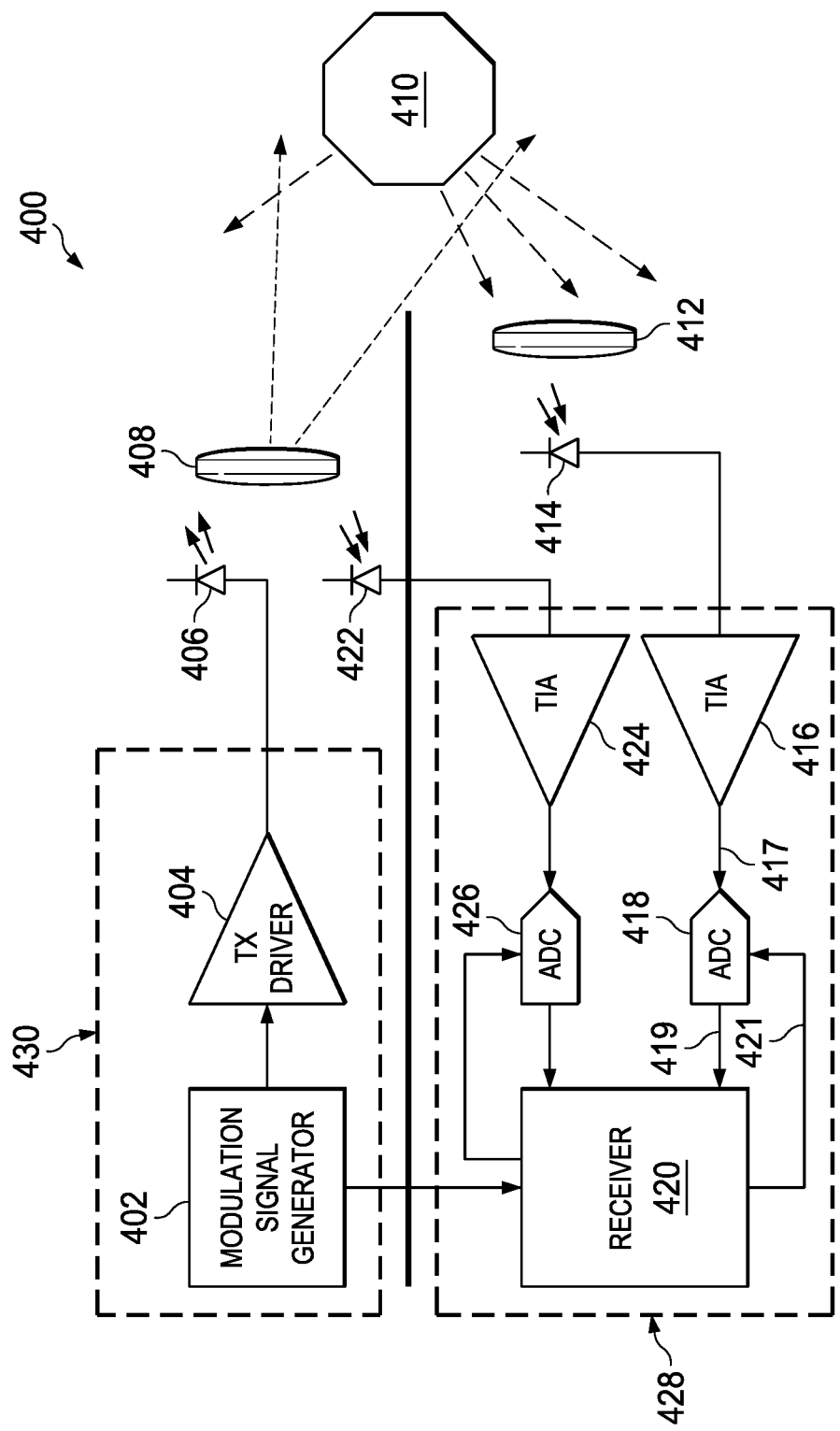
FIG. 4 is a block diagram of an example LIDAR system.

FIG. 4 is a block diagram of an example LIDAR system 400. The apparatus of FIG. 4 includes a modulation signal generator 402 that provides a modulation signal to transmit driver 404, which drives laser diode 406. Optics 408 collimates and directs the modulated light signal onto a field of view that includes object 410. Optics 408 may be a fixed lens system or one of many mechanisms for scanning the light signal across a scene. Object 410 reflects and scatters the light signal. Optics 412 receives a portion of the reflected light signal and focuses it onto a photodiode or photoreceiver, such as photodiode 414. TIA 416 amplifies the output of photodiode 414 and provides the amplified signal as an input signal 417 to ADC 418. ADC 418 provides a digital representation of the output of TIA 416 in the form of a digital received signal 419 to receiver 420. Receiver 420 provides an enable signal 421 to ADC 418 as further explained hereinbelow.

In an example, LIDAR system 400 also includes a transducer or photoreceiver, such as photodiode 422. Laser diode 406 illuminates photodiode 422 directly. The distance from laser diode 406 to photodiode 422 is relatively small and, because the distance from laser diode 406 and photodiode 422 is fixed, receiver 420 can account for this distance. TIA 424 amplifies the output of photodiode 422 and provides the amplified output to ADC 426. ADC 426 provides a digital representation of the output of TIA 424 to receiver 420. In this example, receiver 420 compares the received modulated signals provided from TIAs 416 and 424 to determine an estimated distance of the object 410. In an example, TIAs 416 and 424 and the analog front end (AFE) components in ADC 418 and ADC 426 are the same or similar. This architecture allows receiver 420 to factor out common noise and non-linearities by comparing the two signals.

In examples, an integrated circuit may implement any or all of TIA 416, TIA 424, ADC 418, ADC 426 and receiver 420 as grouping 428 indicates. In other examples, an integrated circuit may also include modulation signal generator 402 and transmit driver 404 as grouping 430 indicates. In other examples, a microcontroller (MCU), an application specific circuit, a field programmable gate array (FPGA), a digital signal processor (DSP) or other processor may implement the receiver 420, which may or may not be included in the same integrated circuit as the other components of grouping 428 and/or grouping 430. In other examples, an integrated circuit may also implement laser diode 406 and/or photodiodes 414 and 422 along with the components of grouping 428 and/or grouping 430. In yet another example, a hybrid package may include any or all components of FIG. 4, excepting object 410, including integrated circuits implementing any or all of modulation signal generator 402, transmit driver 404, laser diode 406, photodiode 414, TIA 416, ADC 418, receiver 420, photodiode 422, TIA 424 and ADC 426.

Figure 5:
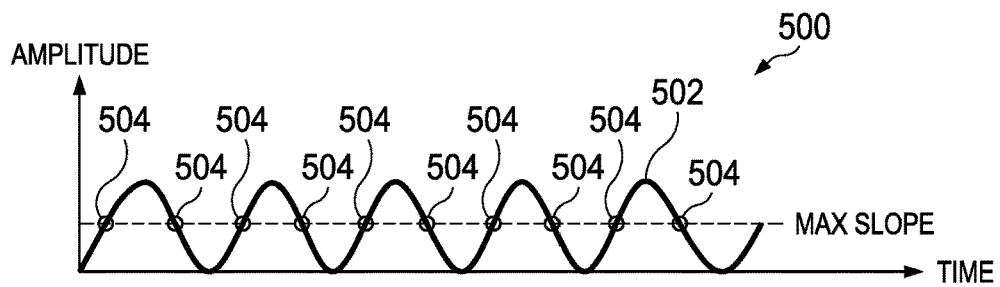
FIG. 5 is a graph showing characteristics of a received continuous wave signal.

FIG. 5 is a graph 500 showing characteristics of a received continuous wave signal. Graph 500 includes received signal 502. Received signal 502 in this example is a sinusoidal wave or continuous wave. During the rise and fall of a sinusoidal wave, a point of maximum slope 504 occurs. This point of maximum slope provides the highest concentration of information regarding the position in time of received signal 502 because it contains the largest amplitude transition per unit of time.

Figure 6:
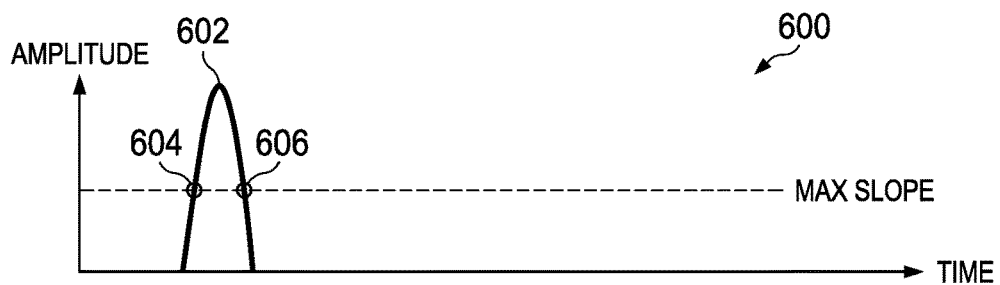
FIG. 6 is a graph showing characteristics of a received pulse signal.

FIG. 6 is a graph 600 showing characteristics of a received pulse signal. As with received signal 502, received signal 602 has a maximum slope 604 on a rising edge and a maximum slope 606 on a falling edge. These points of maximum slope provide the highest concentration of information regarding the timing of received signal 602 because it contains the largest amplitude transition per unit of time.

Figure 7:
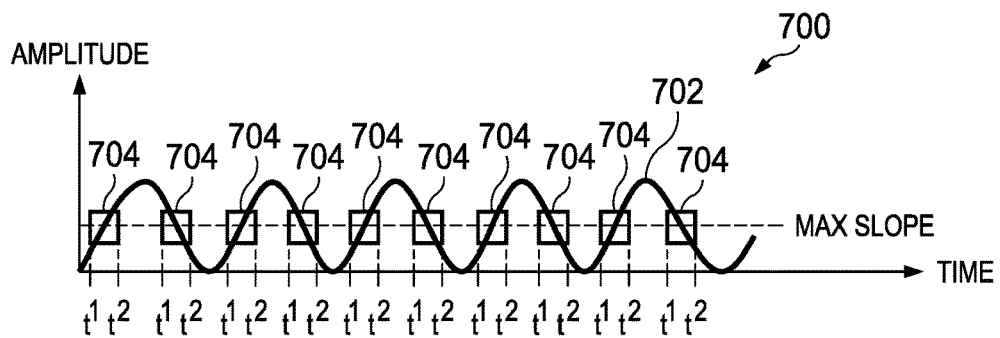
FIG. 7 is a graph of a received continuous wave signal according to an example LIDAR system.

FIG. 7 is a graph of a received continuous wave signal in an example LIDAR. Graph 700 shows the amplitude of received signal 702. Windows 704 are selected portions of time between $t_1$ and $t_2$ that are targeted to the high slope portions of received signal 702. The received signal 702 is derived from a reflection of the signal transmitted by the transmission laser diode, for example laser diode 406 (FIG. 4). After an initial distance measurement, the initial distance is used to determine the approximate timing of received signal 702. That is, a given time instant in the received signal corresponding to a time instant $t_{tx}$ in the transmit signal can be approximated using the previous distance measurement using Equation 3:

$$t_{rx} = \frac{2d}{c} + t_{tx} \quad (3)$$

Where d is the previous distance estimate of the object, c is the speed of light and $t_{rx}$ is the corresponding time instant in the received signal.

Assuming the change in distance d from one measurement cycle to the next is not too great, windows 704 can be determined where there is a high probability that the high information or selected portions of received signal 702 will occur. For example, if a measurement rate is 1 million measurements per second, a measurement cycle is 10. If the initial distance estimate is 10 meters, a 5% movement percentage between cycles is 0.5 m/1 µS or 500,000 m/s. For most applications, it is very unlikely that the object and/or LIDAR will have this level of speed. Therefore, a window 704 can be calculated using Equation 3 where d is equal to d±0.05 d where it is very likely that the targeted high information point of received signal 702 is within that window 704. Windows 704 and other windows identified herein have a vertical dimension. However, the vertical dimension of the windows is for clarity of the figures and is not meaningful.

To conserve power, receiver 420 enables ADCs 418 and 426 (FIG. 4) only during windows 704. For ADC 426, receiver 420 (FIG. 4) determines the windows using Equation 3, where d is equal to the distance between the LIDAR system 100 and object 110, plus or minus the movement percentage. Receiver 420 then compares the signal received during the windows to determine $t_{TOF}$ and thus a new distance estimate for the object. Because ADCs 418 and 426 are only active during the windows, power is saved when the ADCs are not active. In addition, because ADCs 418 and 426 are processing fewer samples per cycle, slower and less power-hungry ADCs may be used. In addition, windows 704 in FIG. 7 are located at every high information point in received signal 702. However, other points may be used. Experimentation and simulation may be used to determine a number and position of the windows to provide the accuracy of distance estimation needed for an application.

Figure 8:
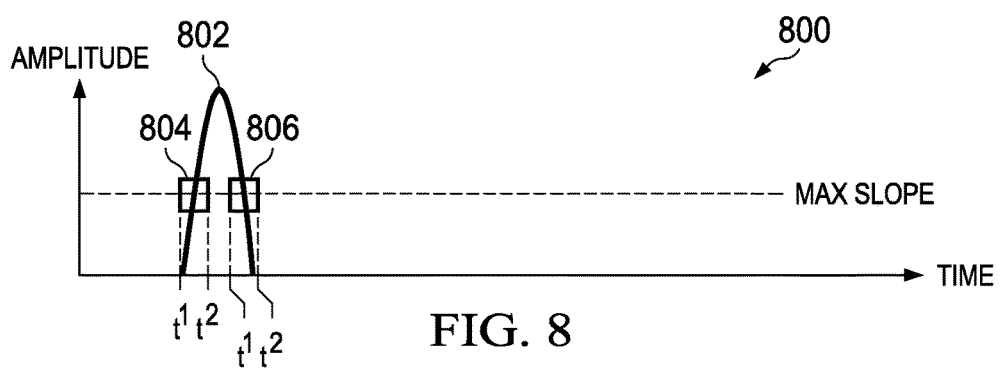
FIG. 8 is a graph of a received signal according to another example LIDAR system.

FIG. 8 is a graph of a received signal where the transmitted signal is a pulse, which is another example. Graph 800 shows a received signal 802 having one pulse. Other examples may include more pulses. The positions of windows 804 and 806 are at the high information regions of received signal 802. The technique described hereinabove regarding FIG. 7 determines the size and position of windows 804 and 806. Because only two windows 804 are involved in this example, even more power may be saved. In addition, windows 804 in FIG. 8 are located at every high information region in received signal 802. However, other regions may be used. Experimentation and simulation may be used to determine a number and position for the windows to provide the accuracy of distance estimation needed for an application.

Figure 9:
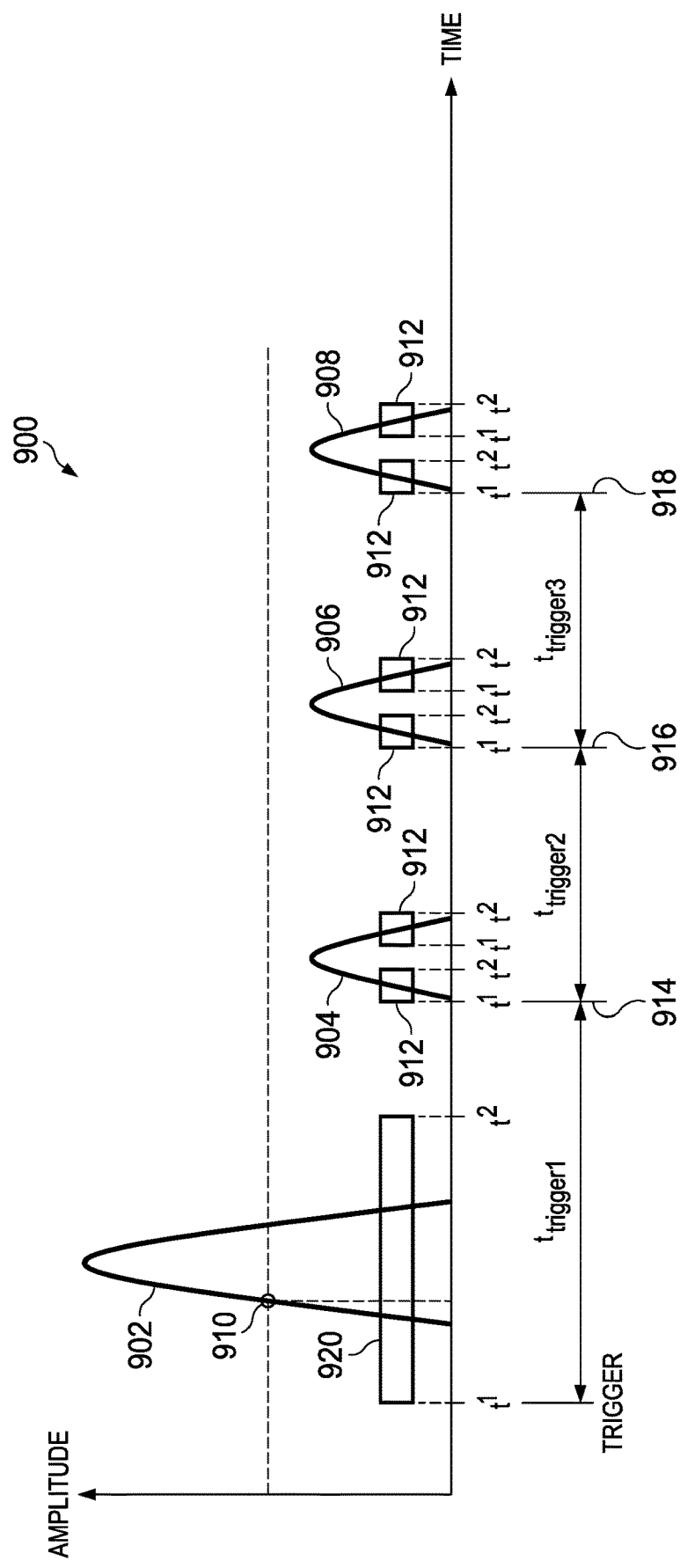
FIG. 9 is a graph of a received signal according to another example LIDAR system.

FIG. 9 is a graph of a received signal according to another example. Graph 900 shows initialization pulse 902. In this example, initialization pulse 902 is a simple semi-sinusoidal pulse. However, it can be any type of readily recognizable signal. Initialization pulse 902 is a significantly stronger pulse than subsequent pulses 904, 906 and 908. However, because initialization pulse 902 is a single pulse of a short duration, the additional energy needed by transmit driver 404 (FIG. 4) to transmit initialization pulse 902 is less than the overall energy savings of the example of FIG. 9. Initially, to set an approximate time to look for trigger point 910, a LIDAR using the example of graph 900 would perform an initial distance estimate based on reception and recognition of initialization pulse 902 along with subsequent pulses 904, 906, and 908. The LIDAR may repeat the initial distance estimation periodically to determine if the object has left the field of view or another object has entered the field of view. After this initial estimate, receiver 420 (FIG. 4) determines windows 912 based on initialization pulse 902, not on a prior distance estimate. That is, receiver 420 (FIG. 4) detects the trigger point 910 when the amplitude of initialization pulse 902 rises above a threshold. Rather than determining the timing of windows 912 using a previously determined distance estimate as in the examples of FIGS. 7 and 8, receiver knows the structure of the transmitted signal, either by a communication from modulation signal generator or by preprogramming. Therefore, receiver knows times $t_{trigger1}$, $t_{trigger2}$ and $t_{trigger3}$ that define trigger points 914, 916 and 918, respectively. Trigger points 914, 916 and 918 trigger windows 912 that enable ADCs 418 and 426 (FIG. 4) at the high information or selected portions of pulses 904, 906 and 908, respectively. Thus, ADCs 418 and 426 (FIG. 4) must remain on after receiving the completed transmission to determine the trigger point 910 of the subsequent transmission. Because the example does not use a prior distance estimate, a speed of the object can be greater than that which falls within the timing of windows in the examples of FIGS. 7 and 8.

In another example, receiver 420 (FIG. 4) determines a wide window 920 from the previously estimated distance so that ADCs 418 and 426 remain off as much as possible while still receiving initialization pulse 902 and thus can determine trigger point 910. The transmission shown in FIG. 9 has an initialization pulse 902 followed by subsequent pulses 904, 906 and 908. However, the subsequent pulses may have a different configuration. For example, the subsequent signal may be a finite length continuous wave. In other examples, the subsequent signal may be a series of finite length continuous waves that may or may not have varying frequency. The subsequent pulses may be any signal that has information points for windows 912 from which the position in time of the received pulse is determinable.

Figure 10:
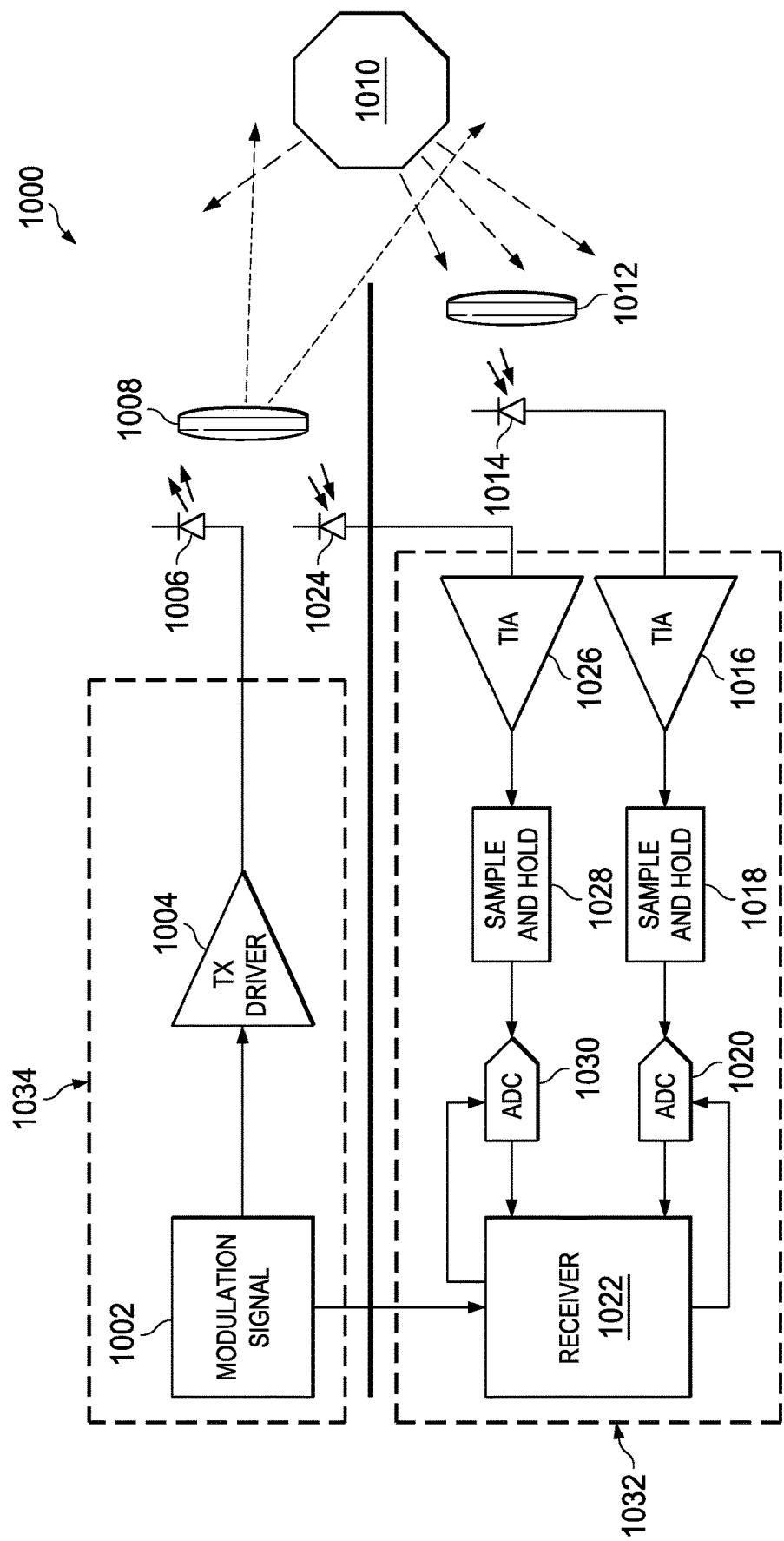
FIG. 10 is a block diagram of an example LIDAR system.

FIG. 10 is a block diagram of an example LIDAR system 1000. Modulation signal generator 1002 provides a modulation signal to transmit driver 1004, which drives laser diode 1006. Optics 1008 collimates and directs the pulsed light onto a field of view that includes object 1010. Optics 1008 may be a fixed lens system or one of many mechanisms for scanning the light signal across a scene. Object 1010 reflects and scatters the light signal. Optics 1012 receives a portion of the reflected light signal and focuses it onto a photodiode or photoreceiver, such as photodiode 1014. TIA 1016 amplifies the output of photodiode 1014 and provides the amplified signal to sample and hold circuit 1018. The operation of sample and hold circuit 1018 is further explained hereinbelow regarding FIG. 11. Sample and hold circuit 1018 provides an output to ADC 1020. ADC 1020 provides a digital representation of the output of TIA 1016 to receiver 1022. Receiver 1022 provides an enable signal to ADC 1020 to enable the operation of ADC 1020 during windows as explained hereinabove regarding FIGS. 4 through 9.

In an example, LIDAR system 1000 also includes photodiode 1024. In this example, laser diode 1006 illuminates photodiode 1024 directly. The distance from laser diode 1006 to photodiode 1024 is relatively small and, because the distance is fixed, receiver 1022 can account for this distance. TIA 1026 amplifies the output of photodiode 1024 and provides the amplified output to sample and hold circuit 1028. As with sample and hold circuit 1018, further explanation of the operation of sample and hold circuit 1028 is provided hereinbelow. ADC 1030 receives the output of sample and hold circuit 1028. ADC 1030 provides a digital representation of the output of TIA 1026 to receiver 1022. In this example, receiver 1022 compares the received modulated signals provided from TIAs 1016 and 1026 to determine an estimated distance of the object 1010. In an example, TIAs 1016 and 1026 and the analog front end (AFE) components in ADC 1020, ADC 1030, sample and hold circuit 1018 and sample and hold circuit 1028 are the same or similar. This architecture allows receiver 1022 to factor out common noise and non-linearities by comparing the two signals.

In examples, an integrated circuit may implement any or all of TIA 1016, TIA 1026, sample and hold circuit 1018, sample and hold circuit 1028, ADC 1020, ADC 1030 and receiver 1022 as grouping 1032 indicates. In other examples, an integrated circuit may also include modulation signal generator 1002 and transmit driver 1004 as grouping 1034 indicates. In other examples, a digital signal processor (DSP) or other processor may implement the receiver 1022, which may or may not be included in the same integrated circuit as the other components of grouping 1032 and/or grouping 1034. In other examples, an integrated circuit may also implement laser diode 1006 and/or photodiodes 1014 and 1024 along with the components of grouping 1032 and/or grouping 1034. In yet another example, a hybrid package may include any or all components of FIG. 10, excepting object 1010, including integrated circuits implementing any or all of modulation signal generator 1002, transmit driver 1004, laser diode 1006, photodiode 1014, TIA 1016, sample and hold circuit 1018, ADC 1020, receiver 1022, photodiode 1024, sample and hold circuit 1028 and ADC 1030.

Figure 11:
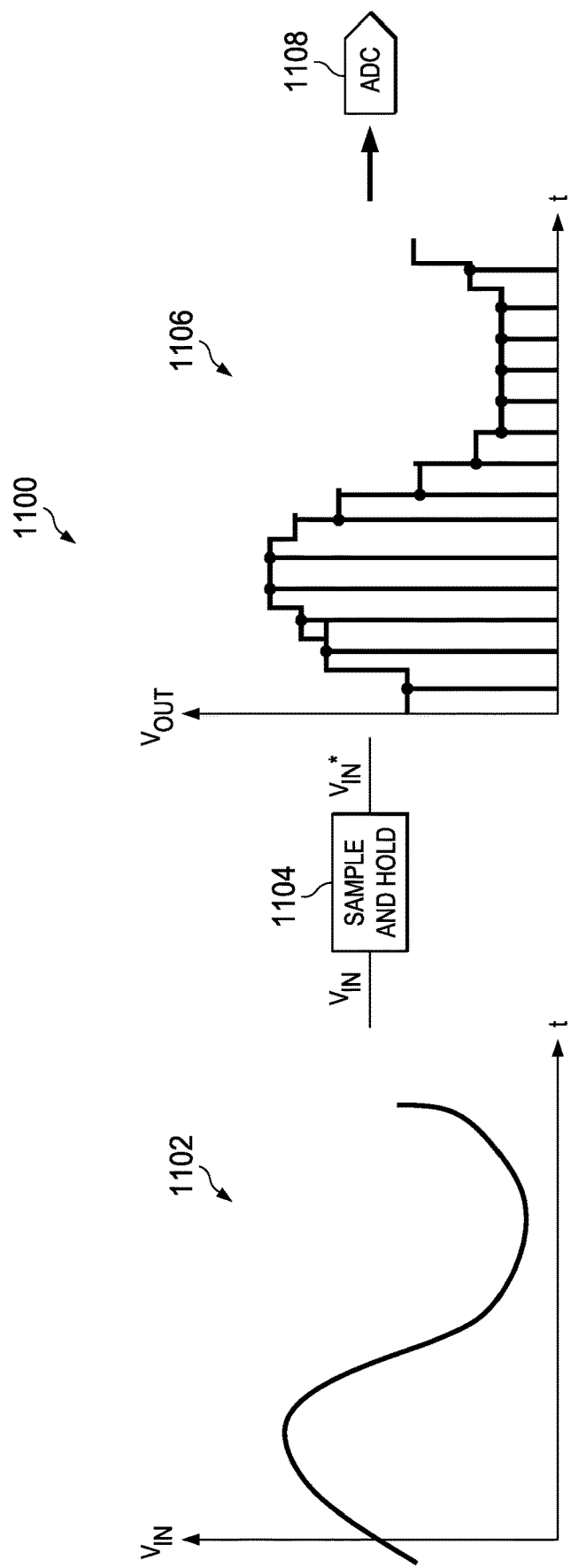
FIG. 11 is a series of diagrams showing the operation of a sample and hold circuit.

FIG. 11 is a series of diagrams 1100 showing the operation of the sample and hold circuit 1018 and sample and hold circuit 1028 (FIG. 10). Graph 1102 shows the output of photodiode 1014 or photodiode 1024 (FIG. 10). The output of photodiode 1014 or photodiode 1024 is the intensity of the light signal as transmitted (photodiode 1024) or reflected of object 1010 (photodiode 1014) (FIG. 10). Sample and hold circuit 1104, which represents either sample and hold circuit 1018 or sample and hold circuit 1028 (FIG. 10), receives the signal shown in graph 1102. Sample and hold circuit 1104 has a bandwidth that is high enough to accurately track the signal of graph 1102. Graph 1106 shows the output $V_{IN}^*$ of sample and hold circuit 1104. The output $V_{IN}^*$ of sample and hold circuit 1104 is a series of steps, the steps being a sampled input signal from graph 1102 labeled $V_{IN}$. ADC 1108, which represents either ADC 1020 or ADC 1030 (FIG. 10), receives the output shown in graph 1106. Because sample and hold circuit 1104 holds the output from the sampled signal for a period of time, a cheaper and more power efficient ADC 1108 may be used because the sample rate of ADC 1108 can be the duration of the steps output by sample and hold circuit 1104 rather than the much higher sample rate necessary to directly convert the input of graph 1102. In addition, because sample and hold circuit 1104 is holding the input of graph 1102, it is available for ADC 1108 (that is, ADC 1020 or ADC 1030 (FIG. 10)) whenever receiver 1022 enables them during the windows discussed hereinabove.

Figure 12:
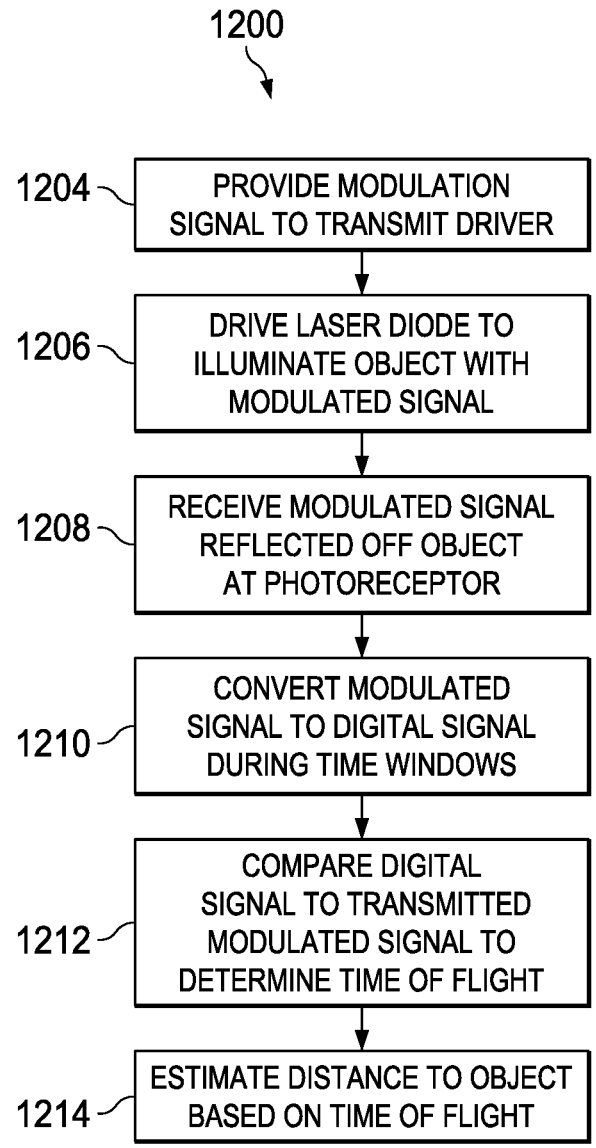
FIG. 12 is a flow diagram of an example method.

FIG. 12 is a flow diagram of an example method 1200. In step 1204, a transmit driver, such as transmit driver 404 (FIG. 4) or transmit driver 1004 (FIG. 10), receives a modulation signal. In step 1206, the transmit driver drives a light source, such as laser diode 406 (FIG. 4) or laser diode 1006 (FIG. 10) to illuminate an object. In step 1208, a photoreceiver, such as photodiode 414 (FIG. 4) or photo-diode 1014 (FIG. 10), receives the modulated signal reflected off the object. In step 1210, an ADC like ADC 418 (FIG. 4) or ADC 1020 (FIG. 10) converts the received signal to a digital signal during time windows, such as windows 704 (FIG. 7), window 804, window 806 (FIG. 8) and/or windows 912 (FIG. 9). In step 1212, a processor, such a receiver 420 (FIG. 4) or receiver 1022 (FIG. 10), compares the digital signal to the transmitted signal to determine a time of flight for the transmitted light signal. In step 1214, a processor such a receiver 420 (FIG. 4) or receiver 1022 (FIG. 10), determines the distance of the object based on the time of flight.

Modifications are possible in the described examples, and other examples are possible, within the scope of the claims.

What is claimed is:

1. An integrated circuit comprising:
   a transmitter including:
      a modulation signal generator having a modulation signal output:
      a driver having a driver input and a driver output, the driver input coupled to the modulation signal output, the driver output adapted to be coupled to a light source;
   a receiver including:
      a first amplifier having a first amplifier input and a first amplifier output, the first amplifier input adapted to be coupled to a first photodiode, and the first amplifier input adapted to be coupled to a first photodiode, and the first signal indicative of first light at the at the first photodiode from the light source;
      a second amplifier having a second amplifier input and a second amplifier output, the second amplifier input adapted to be coupled to a second photodiode, and the second amplifier configured to receive a second signal at the second amplifier input, the second signal indicative of second light at the second photodiode from the light source, in which the second light is reflected light;
      a first sample-and-hold (S/H) having a first S/H input and a first S/H output, the first S/H input coupled to the first amplifier output;
      a second S/H having a second S/H input and a second S/H output, the second S/H input coupled to the second amplifier output;
      a first analog-to-digital converter (ADC) having a first ADC input, a first ADC enable input, and a first ADC output, the first ADC input coupled to the first amplifier output, the first ADC enabled during at least one window;
      a second ADC having a second ADC input, a second ADC enable input, and a second ADC output, the second ADC input coupled to the second amplifier output, the second ADC enabled during at least one window; and
      a processor having a first processor input, a second processor input, a first ADC enable output and a second ADC enable output, the first ADC enable output coupled to the first ADC enable input, and the second enable output coupled to the second ADC enable input.

2. The integrated circuit of claim 1, in which the first amplifier and the second amplifier are transimpedance amplifiers.

3. The integrated circuit of claim 1, in which the processor is configured to provide enable signals at the first and second ADC enable outputs responsive to a distance estimate.

4. The integrated circuit of claim 1, in which the processor is configured to provide enable signals at the first and second ADC enable outputs responsive to a maximum slope in the first and second signals input signals.

5. The integrated circuit of claim 1, in which the first and second signals are continuous wave signals.

6. The integrated circuit of claim 1 in which the first signal is a series of pulses, and a first pulse thereof is an initialization pulse.

7. The integrated circuit of claim 1, in which the first S/H is configured to provide a first series of signals at the first S/H output, and the second S/H is configured to provide a second series at the second S/H output.

8. The integrated circuit of claim 1 in which the processor a microprocessor, a microcontroller (MCU), an application specific circuit, or a field programmable gate array (FPGA).

9. An apparatus comprising:
a modulation signal generator having a modulation signal output;
a driver having a driver input and a driver output, the driver input coupled to the modulation signal output, and the driver output configured to drive a light source with the modulation signal output to illuminate an object with a modulated light signal;
a first amplifier having a first amplifier input and a first amplifier output, the first amplifier input adapted to be coupled to a first photodiode, and the first amplifier configured to receive a first signal at the first amplifier input, the first signal indicative of first light at the first photodiode from the light source;
a second amplifier having a second amplifier input and a second amplifier output, the second amplifier input adapted to be coupled to a second photodiode, and the second amplifier configured to receive a second signal at the second amplifier input, the second signal indicative of second light at the second photodiode from the light source, in which the second light is reflected light;
a first sample-and-hold (S/H) having a first input and a first S/H output, the first S/H input coupled to the first amplifier output;
a second having a second S/H input and a second S/H output, the second S/H input coupled to the second amplifier output;
a first analog-to-digital converter (ADC) having a first ADC input a first ADC enable input, and a first ADC output, the first ADC input coupled to the first amplifier output, the first ADC enabled dining at least one window;
a second ADC having a second ADC input, a second ADC enable input, and a second ADC output, the first ADC input coupled to the second amplifier output, the second ADC enabled during at least one window;
a processor having a first processor input, a second processor input, a first ADC enable output and a second ADC enable output, the first ADC enable output coupled to the first ADC enable input, and the second ADC enable output coupled to the second ADC enable input.

10. The apparatus of claim 9, in which the first amplifier and the second amplifier are transimpedance amplifiers.

11. The apparatus of claim 9, in which the processor is configured to provide enable signals at the first and second ADC enable outputs responsive to a distance estimate.

12. The apparatus of claim 9, in which the processor is configured to provide enable signals as the first and second ADC enable outputs during a period of maximum slope in the first amplifier input signal.

13. The apparatus of claim 9, in which the first and second signals are continuous wave signals.

14. The apparatus of claim 9, in which the first signal is a series of pulses, and a first pulse thereof is an initialization pulse.

15. The apparatus of claim 9, in which the first S/H signal is configured to provide a first series of signals at the first S/H output, and the second S/H signal is configured to provide a second series of signals at the second S/H output.

16. The apparatus of claim 9, in which the processor is a microprocessor, a microcontroller (MCU), an application specific circuit, or a field programmable gate array (FPGA).

17. A method comprising:
providing a modulation signal to a transmit driver;
driving a light source with the transmit driver to illuminate an object with a modulated light signal;
receiving with a first photoreceiver, the modulated light signal;
receiving, with a second photoreceiver, the modulated light signal as reflected off the object;
storing signals from the first and second photoreceivers in first and second sample and hold (S/H) circuits;
converting the received modulated light signal and received reflected light signal to digital signals during at least one time window;
comparing the digital signals to determine a time of flight; and
estimating a distance of the object using the time of flight.

18. The method of claim 17, in which the light source is a laser diode.

19. The method of claim 17, in which the photoreceiver is a photodiode.

20. The method of claim 17, in which the at least one time window occurs during a period of maximum slope in the modulated light signal.

21. The method of claim 17, in which the S/H circuit is reset after the converting the modulated light signal to the digital signal.

22. The method of claim 17, in which the digital signals are each provided by an analog-to-digital converter coupled to a photoreceiver.

23. An integrated circuit comprising:
a transmitter including:
a modulation signal generator having a modulation signal output; and
a driver having a driver input and a driver output, the driver input coupled to the modulation signal output, the driver output configured to provide a drive signal responsive to the modulation signal output; and
a receiver including:
a first amplifier having a first amplifier input and a first amplifier output, the first amplifier input configured to receive a first current signal;
a second amplifier having a second amplifier input and a second amplifier output, the second amplifier input configured to receive a second current signal;
a first sample-and-hold (S/H) having a first S/H input and a first S/H output, the first S/H input coupled to the first amplifier output;
a second S/H having a second S/H input and a second S/H output, the second S/H input coupled to the second amplifier output;
a first analog-to-digital converter (ADC) having a first ADC input, a first ADC enable input, and a first ADC output, the first ADC input coupled to the first amplifier output, the first ADC enabled during at least one window;

a second ADC having a second ADC input, a second ADC enable input, and a second ADC output, the second ADC input coupled to the second amplifier output, the second ADC enabled during at least one window; and a processor having a first processor input, a second processor input, a first ADC enable output and a second ADC enable output, the first ADC enable output coupled to the first ADC enable input, and the second enable output coupled to the second ADC enable input.

24. The integrated circuit of claim 23, in which the first amplifier and the second amplifier are transimpedance amplifiers.

25. The integrated circuit of claim 23, in which the processor is configured to provide enable signals at the first and second ADC enable outputs responsive to a distance estimate.

26. The integrated circuit of claim 23, in which the processor is configured to provide enable signals at the first and second ADC enable outputs responsive to a maximum slope in the first and second current signals.

27. The integrated circuit of claim 23, in which the first and second current signals are continuous wave signals.

28. The integrated circuit of claim 23 in which the first current signal is a series of pulses, and a first pulse thereof is an initialization pulse.

29. The integrated circuit of claim 23, in which the first S/H is configured to provide a first series of signals at the first S/H output, and the second S/H is configured to provide a second series of signals at the second S/H output.

* * * * *